US011724356B2

(12) United States Patent
Seo et al.

(10) Patent No.: US 11,724,356 B2
(45) Date of Patent: Aug. 15, 2023

(54) POROUS POLYURETHANE POLISHING PAD AND PREPARATION METHOD THEREOF

(71) Applicant: SK enpulse Co., Ltd., Gyeonggi-do (KR)

(72) Inventors: Jang Won Seo, Busan (KR); Hyuk Hee Han, Gyeonggi-do (KR); Hye Young Heo, Gyeonggi-do (KR); Joonsung Ryou, Gyeonggi-do (KR); Young Pil Kwon, Gyeonggi-do (KR)

(73) Assignee: SK enpulse Co., Ltd., Gyeonggi-do (KR)

( * ) Notice: Subject to any disclaimer, the term of this patent is extended or adjusted under 35 U.S.C. 154(b) by 1394 days.

(21) Appl. No.: 16/108,607

(22) Filed: Aug. 22, 2018

(65) Prior Publication Data
US 2019/0061097 A1 Feb. 28, 2019

(30) Foreign Application Priority Data

Aug. 23, 2017 (KR) .................. 10-2017-0106466

(51) Int. Cl.
*B24B 37/24* (2012.01)
*C08L 75/04* (2006.01)
(Continued)

(52) U.S. Cl.
CPC .............. *B24B 37/24* (2013.01); *B24D 11/04* (2013.01); *C08G 18/1816* (2013.01); *C08G 18/1825* (2013.01); *C08G 18/1833* (2013.01); *C08G 18/2018* (2013.01); *C08G 18/2081* (2013.01); *C08G 18/244* (2013.01); *C08G 18/246* (2013.01); *C08G 18/42* (2013.01); *C08G 18/44* (2013.01); *C08G 18/48* (2013.01); *C08G 18/6216* (2013.01); *C08G 18/73* (2013.01); *C08G 18/755* (2013.01); *C08G 18/757* (2013.01); *C08G 18/7614* (2013.01); *C08G 18/7621* (2013.01); *C08G 18/7671* (2013.01); *C08G 18/7678* (2013.01); *C08G 18/7685* (2013.01); *C08J 9/0028* (2013.01);
(Continued)

(58) Field of Classification Search
None
See application file for complete search history.

(56) References Cited

U.S. PATENT DOCUMENTS 6,477,926 B1 * 11/2002 Swisher ................... B24D 3/32
451/526
6,935,931 B2 * 8/2005 Prasad ..................... B24D 3/32
451/526

FOREIGN PATENT DOCUMENTS

| JP | 2004-1169 | 1/2004 |
| JP | 2006-111700 | 4/2006 |

(Continued)

*Primary Examiner* — Bryan D. Ripa
*Assistant Examiner* — Ross J Christie
(74) *Attorney, Agent, or Firm* — IP & T Group LLP

(57) ABSTRACT

Embodiments relate to a porous polyurethane polishing pad for use in a chemical mechanical planarization (CMP) process of semiconductors and a process for producing the same. In the porous polyurethane polishing pad, it is possible to control the size and distribution of pores, whereby the polishing performance (i.e., polishing rate) of the polishing pad can be adjusted, by way of employing thermally expanded microcapsules as a solid phase foaming agent and an inert gas as a gas phase foaming agent.

9 Claims, 1 Drawing Sheet

(51) Int. Cl.
  *H01L 21/67* (2006.01)
  *C08G 18/76* (2006.01)
  *C08G 18/18* (2006.01)
  *C08G 18/62* (2006.01)
  *C08G 18/20* (2006.01)
  *C08J 9/12* (2006.01)
  *C08J 9/00* (2006.01)
  *C08G 18/75* (2006.01)
  *C08G 18/48* (2006.01)
  *B24D 11/04* (2006.01)
  *C08G 18/24* (2006.01)
  *C08G 18/42* (2006.01)
  *C08G 18/73* (2006.01)
  *C08J 9/32* (2006.01)
  *C08G 18/44* (2006.01)

(52) U.S. Cl.
  CPC ........... *C08J 9/0042* (2013.01); *C08J 9/0052* (2013.01); *C08J 9/122* (2013.01); *C08J 9/32* (2013.01); *C08L 75/04* (2013.01); *H01L 21/67092* (2013.01); *C08G 2110/005* (2021.01); *C08G 2110/0025* (2021.01); *C08J 2201/026* (2013.01); *C08J 2203/06* (2013.01); *C08J 2203/22* (2013.01); *C08J 2205/044* (2013.01); *C08J 2375/04* (2013.01)

(56) References Cited

FOREIGN PATENT DOCUMENTS

| | | | |
|---|---|---|---|
| JP | 2013-539927 | 10/2013 | |
| JP | 2014-111296 | 6/2014 | |
| KR | 1020160027075 | 3/2016 | |
| WO | WO-2016122888 A1 * | 8/2016 | ........... B24B 37/205 |

* cited by examiner

POROUS POLYURETHANE POLISHING PAD AND PREPARATION METHOD THEREOF

The present application claims priority of Korean patent application number 10-2017-0106466, filed on Aug. 23, 2017, which is incorporated herein by reference in its entirety.

TECHNICAL FIELD

Embodiments relate to a porous polyurethane polishing pad for use in a chemical mechanical planarization (CMP) process of semiconductors and a process for producing the same.

BACKGROUND ART

The chemical mechanical planarization (CMP) process in a process for preparing semiconductors refers to a step in which a wafer is fixed to a head and in contact with the surface of a polishing pad mounted on a platen, and the wafer is then chemically treated by a slurry supplied onto it while the platen and the head are relatively moved to thereby mechanically planarize the irregularities on the wafer surface.

A polishing pad is an essential member that plays an important role in such a CMP process. In general, a polishing pad is made of a polyurethane-based resin and has grooves on its surface for a large flow of a slurry and pores for supporting a fine flow thereof.

The pores in a polishing pad may be formed by using a solid phase foaming agent having voids, a liquid phase foaming agent filled with a volatile liquid, an inert gas, a fiber, or the like, or by generating a gas by a chemical reaction.

The technique of forming pores using an inert gas or a volatile liquid phase foaming agent has the advantage that any material that may affect the CMP process is not discharged. However, it is difficult to precisely control the size of pores and the density of the pad since it is inevitable to deal with a gas phase, which is not conveniently controlled. It is particularly difficult to produce uniform pores of 50 μm or less. In addition, there is a problem that it is very difficult to control the size of pores and the density of the pad without changing the composition of the polyurethane matrix of the polishing pad.

As the solid phase foaming agent, microcapsules (i.e., thermally expanded microcapsules), whose size has been adjusted by a thermal expansion, are used. Since the thermally expanded microcapsules in a structure of microballoons already expanded have a uniform particle size, it is possible to uniformly control the size of pores. However, the thermally expanded microcapsules have a disadvantage in that it is difficult to control the pores to be formed since the shape of the microcapsules changes under the reaction condition of a high temperature of 100° C. or higher.

Accordingly, although pores can be formed in conformation with the size and distribution as designed when micropores are implemented using a single foaming agent as in the conventional processes, the degree of freedom in designing the pores is low, and there is a limit in controlling the pore distribution.

Korean Laid-open Patent Publication No. 2016-0027075 discloses a process for producing a low-density polishing pad using an inert gas and a pore inducing polymer, and a low-density polishing pad. However, this publication fails to teach the adjustment of the size and distribution of pores and the polishing rate of the polishing pad.

DISCLOSURE OF THE INVENTION

Technical Problem to be Solved

Accordingly, an object of the embodiments is to provide a porous polyurethane polishing pad produced using an inert gas and thermally expanded microcapsules as a foaming agent and having pores whose size and distribution are controlled, and a process for producing the same.

Solution to the Problem

In order to achieve the above object, an embodiment provides a porous polyurethane polishing pad, which comprises a polyurethane resin and pores distributed in the polyurethane resin, wherein in the pore size distribution of the pores based on the cross-sectional area of the polishing pad, the pore size at the maximum peak is smaller than the average pore size, the pore size at the maximum peak is 18 to 28 μm, the average pore size is 24 to 36 μm, and the sum of the cross-sectional areas of the pores having a pore size larger than the pore size at the maximum peak by 15 μm or more is larger than the sum of the cross-sectional areas of the pores having a pore size larger than the pore size at the maximum peak by 10 μm to less than 15 μm.

Another embodiment provides a process for producing a porous polyurethane polishing pad, which comprises injecting an inert gas when a urethane-based prepolymer, a curing agent, a solid phase foaming agent, a reaction rate controlling agent, and a silicone-based surfactant are mixed to mold the mixture while pores are formed, wherein the solid phase foaming agent is employed in an amount of 1 to 3 parts by weight based on 100 parts by weight of the urethane-based prepolymer.

Advantageous Effects of the Invention

In the porous polyurethane polishing pad according to the embodiments, it is possible to control the size and distribution of pores, whereby the polishing performance (i.e., polishing rate) of the polishing pad can be adjusted, by way of employing thermally expanded microcapsules as a solid phase foaming agent and an inert gas as a gas phase foaming agent.

REFERENCE NUMERAL OF THE DRAWINGS

A: pore size at the maximum peak

BEST MODE FOR CARRYING OUT THE INVENTION

Porous Polyurethane Polishing Pad

The porous polyurethane polishing pad according to an embodiment comprises a polyurethane resin and pores distributed in the polyurethane resin, wherein in the pore size distribution of the pores based on the cross-sectional area of the polishing pad, the pore size at the maximum peak is smaller than the average pore size, the pore size at the maximum peak is 18 to 28 μm, the average pore size is 24 to 36 μm, and the sum of the cross-sectional areas of the pores having a pore size larger than the pore size at the maximum peak by 15 μm or more is larger than the sum of the cross-sectional areas of the pores having a pore size larger than the pore size at the maximum peak by 10 μm to less than 15 μm.

The porous polyurethane polishing pad is made of a polyurethane resin, and the polyurethane resin may be derived from a urethane-based prepolymer having an isocyanate terminal group. In such event, the polyurethane resin comprises monomer units that constitute the prepolymer.

A prepolymer generally refers to a polymer having a relatively low molecular weight wherein the degree of polymerization is adjusted to an intermediate level so as to conveniently mold a molded article finally produced in the process of producing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenyl methane diisocyanate, hexamethylene diisocyanate, dicyclohexylmethane diisocyanate, and isophorone diisocyanate.

For example, the polyol that may be used in the preparation of the urethane-based prepolymer may be at least one polyol selected from the group consisting of a polyether polyol, a polyester polyol, a polycarbonate polyol, and an acryl polyol. The polyol may have a weight average molecular weight (Mw) of 300 to 3,000 g/mole.

The polyurethane resin may have a weight average molecular weight of 500 to 3,000 g/mole. Specifically, the polyurethane resin may have a weight average molecular weight (Mw) of 600 to 2,000 g/mole or 700 to 1,500 g/mole.

Pore

The pores are present as dispersed in the polyurethane resin. Specifically, the pores may be derived from the thermally expanded microcapsules used as a solid phase foaming agent or formed from an inert gas.

Figure 1:
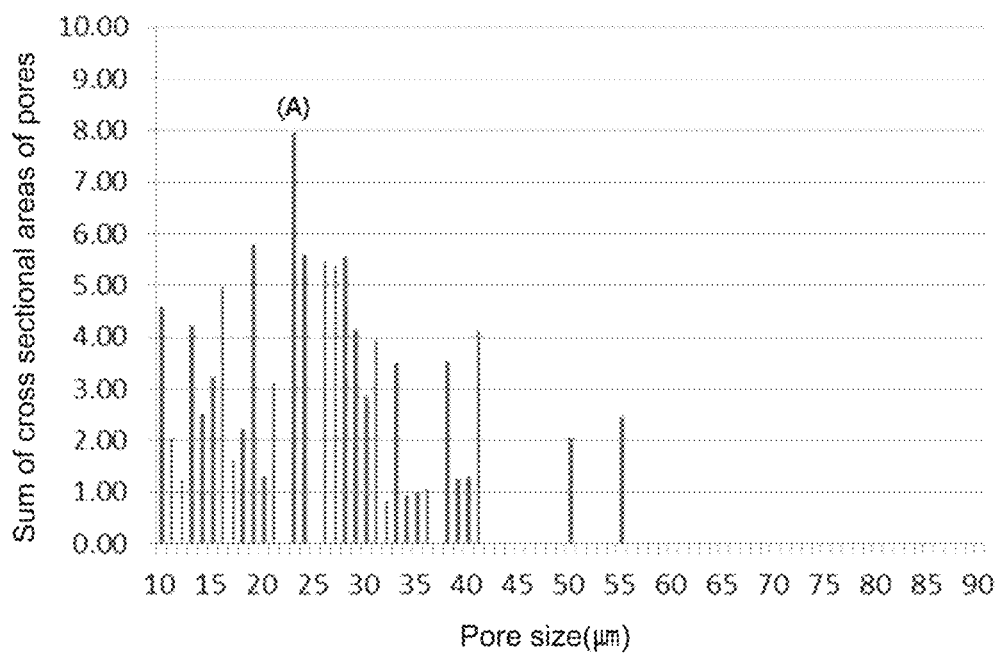
FIG. 1 is a graph showing the pore size distribution based on the cross sectional area of the porous polyurethane polishing pad produced in Example 1.

Referring to FIG. 1, in the pore size distribution of the pores based on 100% of the sum of the cross-sectional areas of the pores, the pore size at the maximum peak is smaller than the average pore size, and the sum of the cross-sectional areas of the pores having a pore size larger than the pore size at the maximum peak by 15 μm or more is larger than the sum of the cross-sectional areas of the pores having a pore size larger than the pore size at the maximum peak by 10 μm to less than 15 μm. Specifically, the difference between the sum of the cross-sectional areas of the pores having a pore size larger than the pore size at the maximum peak by 15 μm or more and the sum of the cross-sectional areas of the pores having a pore size larger than the pore size at the maximum peak by 10 μm to less than 15 μm is 1 to 10% or 5 to 9%.

The pore size at the maximum peak is 18 to 28 μm, and the average pore size is 24 to 36 μm. Specifically, the pore size at the maximum peak may be smaller than the average pore size by 1 to 10 μm. More specifically, the pore size at the maximum peak may be smaller than the average pore size by 5 to 10 μm or 5 to 8 μm.

The porous polyurethane polishing pad may contain the pores in an amount of 30 to 70% by volume or 30 to 60% by volume based on the total volume of the polishing pad.

The pores may comprise first pores formed by the solid phase foaming agent and second pores formed by the gas phase foaming agent. Specifically, the second pores may comprise pores having a pore size larger than the pore size at the maximum peak by 15 μm or more and pores having a pore size smaller than the pore size at the maximum peak.

Additional Additives

The porous polyurethane polishing pad may further comprise at least one reaction rate controlling agent selected from the group consisting of a tertiary amine-based compound and an organometallic compound; and a silicone-based surfactant.

The reaction rate controlling agent may be a reaction promoter or a reaction retarder. More specifically, the reaction rate controlling agent may be a reaction promoter. For example, the reaction rate controlling agent may comprise at least one selected from the group consisting of triethylene diamine (TEDA), dimethyl ethanol amine (DMEA), tetramethyl butane diamine (TMBDA), 2-methyl-triethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N,N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may be at least one selected from the group consisting of benzyldimethyl amine, N,N-dimethylcyclohexyl amine, and triethyl amine.

Silicone-Based Surfactant

The silicone-based surfactant may act to prevent the pores to be formed from overlapping and coalescing with each other. The kind of the surfactant is not particularly limited as long as it is commonly used in the production of a polishing pad.

Physical Properties of the Polishing Pad

The porous polyurethane polishing pad may have a thickness of 1 to 5 mm. Specifically, the porous polyurethane polishing pad may have a thickness of 1 to 3 mm, 1 to 2.5 mm, 1.5 to 5 mm, 1.5 to 3 mm, 1.5 to 2.5 mm, 1.8 to 5 mm, 1.8 to 3 mm, or 1.8 to 2.5 mm. If the thickness of the polishing pad is within the above range, the basic physical properties as a polishing pad can be sufficiently exhibited.

The porous polyurethane polishing pad may have grooves on its surface for mechanical polishing. The grooves may have a depth, a width, and a spacing as desired for mechanical polishing, which are not particularly limited.

The density and physical properties of the porous polyurethane polishing pad can be controlled through the molecular structure of the urethane-based prepolymer polymerized by the reaction between an isocyanate and a polyol. Specifically, the porous polyurethane polishing pad may have a hardness of 30 to 80 Shore D. More specifically, the porous polyurethane polishing pad may have a hardness of 40 to 70 Shore D.

Specifically, the porous polyurethane polishing pad may have a specific gravity of 0.6 to 0.9 g/cm$^3$. More specifically, the porous polyurethane polishing pad may have a specific gravity of 0.7 to 0.85 g/cm$^3$.

Specifically, the porous polyurethane polishing pad may have a tensile strength of 10 to 100 kgf/cm². More specifically, the porous polyurethane polishing pad may have a tensile strength of 15 to 70 kgf/cm².

Specifically, the porous polyurethane polishing pad may have an elongation of 30% to 300%. More specifically, the porous polyurethane polishing pad may have an elongation of 50% to 200%.

The porous polyurethane polishing pad may have a polishing rate of silicon oxide ($SiO_x$) of 0.8 to 0.99 when the polishing rate of tungsten is 1. Specifically, the porous polyurethane polishing pad may have a polishing rate of silicon oxide ($SiO_x$) of 0.82 to 0.98 when the polishing rate of tungsten is 1. More specifically, the porous polyurethane polishing pad may have a polishing rate of silicon oxide of 850 Å/min to 1,500 Å/min, 860 Å/min to 1,300 Å/min, or 900 Å/min to 1,300 Å/min.

Process for Producing a Porous Polyurethane Polishing Pad

According to an embodiment, there is provided a process for producing a porous polyurethane polishing pad, which comprises injecting an inert gas when a urethane-based prepolymer, a curing agent, a solid phase foaming agent, a reaction rate controlling agent, and a silicone-based surfactant are mixed to mold the mixture while pores are formed, wherein the solid phase foaming agent is employed in an amount of 1 to 3 parts by weight based on 100 parts by weight of the urethane-based prepolymer.

Supplying of Raw Materials

The urethane-based prepolymer may be prepared by reacting an isocyanate compound with a polyol as described above. The specific types of the isocyanate compound and the polyol are as exemplified above in the polishing pad.

The urethane-based prepolymer may have a weight average molecular weight of 500 to 3,000 g/mole. Specifically, the urethane-based prepolymer may have a weight average molecular weight (Mw) of 600 to 2,000 g/mole or 800 to 1,000 g/mole.

As an example, the urethane-based prepolymer may be a polymer having a weight average molecular weight (Mw) of 500 to 3,000 g/mole, which is polymerized from toluene diisocyanate as an isocyanate compound and polytetramethylene ether glycol as a polyol.

Curing Agent

The curing agent may be at least one selected from the group consisting of an amine compound and an alcohol compound. Specifically, the curing agent may comprise at least one selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine, diaminodiphenyl methane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

Solid Phase Foaming Agent

The solid phase foaming agent is thermally expanded (i.e., size-controlled) microcapsules and may be in a structure of micro-balloons having an average pore size of 5 to 200 μm. The thermally expanded (i.e., size-controlled) microcapsules may be obtained by thermally expanding thermally expandable microcapsules.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic copolymer. Furthermore, the foaming agent encapsulated in the inside may be at least one selected from the group consisting of hydrocarbons having 1 to 7 carbon atoms. Specifically, the foaming agent encapsulated in the inside may be selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and the like; and a tetraalkylsilane such as tetramethylsilane, trimethylethylsilane, trimethylisopropylsilane, trimethyl-n-propylsilane, and the like.

The solid phase foaming agent may be employed in an amount of 1 to 3 parts by weight based on 100 parts by weight of the urethane-based prepolymer. Specifically, the solid phase foaming agent may be employed in an amount of 1.3 to 2.7 parts by weight or 1.3 to 2.6 parts by weight based on 100 parts by weight of the urethane-based prepolymer.

Reaction Rate Controlling Agent

The reaction rate controlling agent may be at least one reaction promoter selected from the group consisting of a tertiary amine-based compound and an organometallic compound. Specifically, the reaction promoter may comprise at least one selected from the group consisting of triethylene diamine (TEDA), dimethyl ethanol amine (DMEA), tetramethyl butane diamine (TMBDA), 2-methyl-triethylene diamine, dimethyl cyclohexyl amine (DMCHA), triethyl amine (TEA), triisopropanol amine (TIPA), 1,4-diazabicyclo(2,2,2)octane, bis(2-methylaminoethyl) ether, trimethylaminoethylethanol amine, N,N,N,N,N"-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide. Specifically, the reaction rate controlling agent may comprise at least one selected from the group consisting of benzyldimethyl amine, N,N-dimethylcyclohexyl amine, and triethyl amine.

The reaction rate controlling agent may be employed in an amount of 0.2 to 2 parts by weight based on 100 parts by weight of the urethane-based prepolymer. Specifically, the reaction rate controlling agent may be employed in an amount of 0.2 to 1.8 parts by weight, 0.2 to 1.7 parts by weight, 0.2 to 1.6 parts by weight, or 0.2 to 1.5 parts by weight, based on 100 parts by weight of the urethane-based prepolymer. If the reaction rate controlling agent is employed in an amount within the above range, the reaction rate (i.e., the time for solidification) of the mixture (i.e., the urethane-based prepolymer, the curing agent, the solid phase foaming agent, the reaction rate controlling agent, and the silicone-based surfactant) is properly controlled so that a polishing pad having pores of a desired size can be produced.

Silicone-Based Surfactant

The silicone-based surfactant may act to prevent the pores to be formed from overlapping and coalescing with each other.

The silicone-based surfactant may be employed in an amount of 0.2 to 2 parts by weight based on 100 parts by weight of the urethane-based prepolymer. Specifically, the surfactant may be employed in an amount of 0.2 to 1.9 parts by weight, 0.2 to 1.8 parts by weight, 0.2 to 1.7 parts by weight, 0.2 to 1.6 parts by weight, or 0.2 to 1.5 parts by weight, based on 100 parts by weight of the urethane-based prepolymer. If the amount of the silicone-based surfactant is within the above range, pores derived from the gas phase foaming agent can be stably formed and maintained in the mold.

Inert Gas

The inert gas is fed when the urethane-based prepolymer, the curing agent, the solid phase foaming agent, the reaction rate controlling agent, and the silicone-based surfactant are mixed and reacted, to thereby form pores in the polishing pad. The kind of the inert gas is not particularly limited as long as it is a gas that does not participate in the reaction between the prepolymer and the curing agent. For example, the inert gas may be at least one selected from the group consisting of nitrogen gas ($N_2$), argon gas (Ar), and helium (He). Specifically, the inert gas may be nitrogen gas ($N_2$) or argon gas (Ar).

The inert gas may be fed in a volume of 15 to 30% based on the total volume of the urethane-based prepolymer, the curing agent, the solid phase foaming agent, the reaction rate controlling agent, and the silicone-based surfactant. Specifically, the inert gas may be fed in a volume of 20 to 30% based on the total volume of the urethane-based prepolymer, the curing agent, the solid phase foaming agent, the reaction rate controlling agent, and the silicone-based surfactant.

As an example, the urethane-based prepolymer, the curing agent, the solid phase foaming agent, the reaction rate controlling agent, the silicone-based surfactant, and the inert gas may be put into the mixing process substantially at the same time. As another example, the urethane-based prepolymer, the solid phase foaming agent, and the silicone-based surfactant may be mixed in advance, and the curing agent, the reaction rate controlling agent, and the inert gas may be subsequently introduced. That is, the reaction rate controlling agent is not mixed in advance with the urethane-based prepolymer or the curing agent. If the reaction rate controlling agent is mixed in advance with the urethane-based prepolymer, curing agent, or the like, it may be difficult to control the reaction rate. In particular, the stability of the prepolymer having an isocyanate terminal group may be significantly impaired.

The mixing initiates the reaction of the urethane-based prepolymer and the curing agent by mixing them and uniformly disperses the solid phase foaming agent and the inert gas in the raw materials. In such event, the reaction rate controlling agent may intervene in the reaction between the urethane-based prepolymer and the curing agent from the beginning of the reaction, to thereby control the reaction rate. Specifically, the mixing may be carried out at a speed of 1,000 to 10,000 rpm or 4,000 to 7,000 rpm. Within the above speed range, it may be more advantageous for the inert gas and the solid phase foaming agent to be uniformly dispersed in the raw materials.

The urethane-based prepolymer and the curing agent may be mixed at a molar equivalent ratio of 1:0.8 to 1.2, or a molar equivalent ratio of 1:0.9 to 1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Reaction and Formation of Pores

The urethane-based prepolymer and the curing agent react with each other upon the mixing thereof to form a solid polyurethane, which is then formed into a sheet or the like. Specifically, the isocyanate terminal group in the urethane-based prepolymer can react with the amine group, the alcohol group, and the like in the curing agent. In such event, the inert gas and the solid phase foaming agent are uniformly dispersed in the raw materials to form pores without participating in the reaction between the urethane-based prepolymer and the curing agent.

In addition, the reaction rate controlling agent adjusts the size of the pores by promoting or retarding the reaction between the urethane-based prepolymer and the curing agent. For example, if the reaction rate controlling agent is a reaction retarder for delaying the reaction, the time for which the inert gas finely dispersed in the raw materials are combined with each other is prolonged, so that the average size of the pores can be increased. On the other hand, if the reaction rate controlling agent is a reaction promoter for expediting the reaction, the time for which the inert gas finely dispersed in the raw materials are combined with each other is shortened, so that the average size of the pores can be reduced.

Molding

The molding is carried out using a mold. Specifically, the raw materials (i.e., a mixture comprising the urethane-based prepolymer, the curing agent, the solid phase foaming agent, the reaction rate controlling agent, the silicone-based surfactant, and the inert gas) sufficiently stirred in a mixing head or the like may be injected into a mold to fill the inside thereof. The reaction between the urethane-based prepolymer and the curing agent is completed in the mold to thereby produce a molded body in the form of a solidified cake that conforms to the shape of the mold.

Thereafter, the molded body thus obtained can be appropriately sliced or cut into a sheet for the production of a polishing pad. As an example, a molded body is produced in a mold having a height of 5 to 50 times the thickness of a polishing pad to be finally produced and is then sliced in the same thickness to produce a plurality of sheets for the polishing pads at a time. In such event, a reaction retarder may be used as a reaction rate controlling agent in order to secure a sufficient solidification time. Thus, it is possible to produce sheets for polishing pads while the height of the mold is about 5 to about 50 times the thickness of the polishing pad finally produced. However, the sliced sheets may have pores of different sizes depending on the molded location inside the mold. That is, a sheet molded at the lower position of the mold has pores of a fine size, whereas a sheet molded at the upper position of the mold may have pores of a larger size than that of a sheet formed at the lower position.

Therefore, it is preferable to use a mold capable of producing one sheet by one molding in order for sheets to have pores of a uniform size each other. To this end, the height of the mold may not significantly differ from the thickness of the porous polyurethane polishing pad to be finally produced. For example, the molding may be carried out using a mold having a height of 1 to 3 times the thickness of the porous polyurethane polishing pad to be finally produced. More specifically, the mold may have a height of 1.1 to 2.5 times, or 1.2 to 2 times, the thickness of the polishing pad to be finally produced. In such event, a reaction promoter may be used as the reaction rate controlling agent to form pores having a more uniform size.

Thereafter, the top and bottom ends of the molded body obtained from the mold may be cut out, respectively. For example, each of the top and bottom ends of the molded body may be cut out by ⅓ or less, 1/22 to 3/10, or 1/12 to ¼ of the total thickness of the molded body.

As a specific example, the molding is carried out using a mold having a height of 1.2 to 2 times the thickness of the porous polyurethane polishing pad to be finally produced, and a further step of cutting out each of the top and bottom ends of the molded body obtained from the mold upon the molding by 1/12 to ¼ of the total thickness of the molded body may then be carried out.

Subsequent to the cutting step, the above production process may further comprise the steps of machining grooves on the surface of the molded body, bonding with the lower part, inspection, packaging, and the like. These steps may be carried out in a conventional manner for producing a polishing pad.

In the polishing pad produced according to the process as described above, in the pore size distribution of the pores based on the cross-sectional area of the polishing pad, the pore size at the maximum peak is smaller than the average pore size, the pore size at the maximum peak is 18 to 28 μm, the average pore size is 24 to 36 μm, and the sum of the cross-sectional areas of the pores having a pore size larger than the pore size at the maximum peak by 15 μm or more is larger than the sum of the cross-sectional areas of the pores having a pore size larger than the pore size at the maximum peak by 10 μm to less than 15 μm.

MODE FOR THE INVENTION

Hereinafter, the present invention is explained in detail by the following Examples. However, these examples are set forth to illustrate the present invention, and the scope of the present invention is not limited thereto.

EXAMPLE

Example 1: Production of a Porous Polyurethane Polishing Pad 1-1: Configuration of the Device In a casting machine equipped with feeding lines for a urethane-based prepolymer, a curing agent, an inert gas, and a reaction rate controlling agent, PUGL-550D (supplied by SKC) having an unreacted NCO content of 9.1% by weight was charged to the prepolymer tank, and bis(4-amino-3-chlorophenyl)methane (supplied by Ishihara) was charged to the curing agent tank. Nitrogen ($N_2$) as an inert gas and a reaction promoter (a tertiary amine compound supplied by Air Products under the brand name of A1) as a reaction rate controlling agent were prepared. In addition, 2 parts by weight of a solid phase foaming agent (supplied by AkzoNobel under the brand name of Expancel 461 DET 20 d40 with an average pore size of 20 μm) and 1 part by weight of a silicone-based surfactant (supplied by Evonik under the brand name of B8462) were mixed in advance based on 100 parts by weight of the urethane-based prepolymer, which was then charged to the prepolymer tank.

1-2: Production of a Sheet

The urethane-based prepolymer, the curing agent, the reaction rate controlling agent, and the inert gas were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. In addition, the inert gas was constantly fed in a volume of 25% based on the total volume of the urethane-based prepolymer, the curing agent, the solid phase foaming agent, the reaction rate controlling agent, and the silicone-based surfactant. The reaction rate controlling agent was fed in an amount of 1 part by weight based on 100 parts by weight of the urethane-based prepolymer.

The mixed raw materials were injected into a mold (having a width of 1,000 mm, a length of 1,000 mm, and a height of 3 mm) and solidified to obtain a sheet. Thereafter, the surface of the porous polyurethane was ground using a grinder and then grooved using a tip so that the porous polyurethane had an average thickness of 2 mm.

The porous polyurethane and suede (a substrate layer with an average thickness of 1.1 mm) were thermally bonded at 120° C. with a hot-melt film (supplied by SKC under the brand name of TF-00) to produce a polishing pad.

Test Example

The properties of the polishing pad produced in Example 1 were measured according to the following conditions and procedures. The results are shown in Table 1 below and FIGS. 1 and 2.

(1) Hardness

The Shore D hardness was measured. The polishing pad was cut into a size of 2 cm×2 cm (in a thickness of 2 mm) and then allowed to stand for 16 hours under the conditions of a temperature of 23° C., 30° C., 50° C., and 70° C. and a humidity of 50±5%. Thereafter, the hardness of the polishing pad was measured using a hardness meter (D-type hardness meter).

(2) Specific Gravity

The polishing pad was cut into a rectangle of 4 cm×8.5 cm (in a thickness of 2 mm) and then allowed to stand for 16 hours under the conditions of a temperature of 23±2° C. and a humidity of 50±5%. The specific gravity of the polishing pad was measured using a gravimeter.

(3) Average Pore Size and Pore Size Distribution

Figure 2:
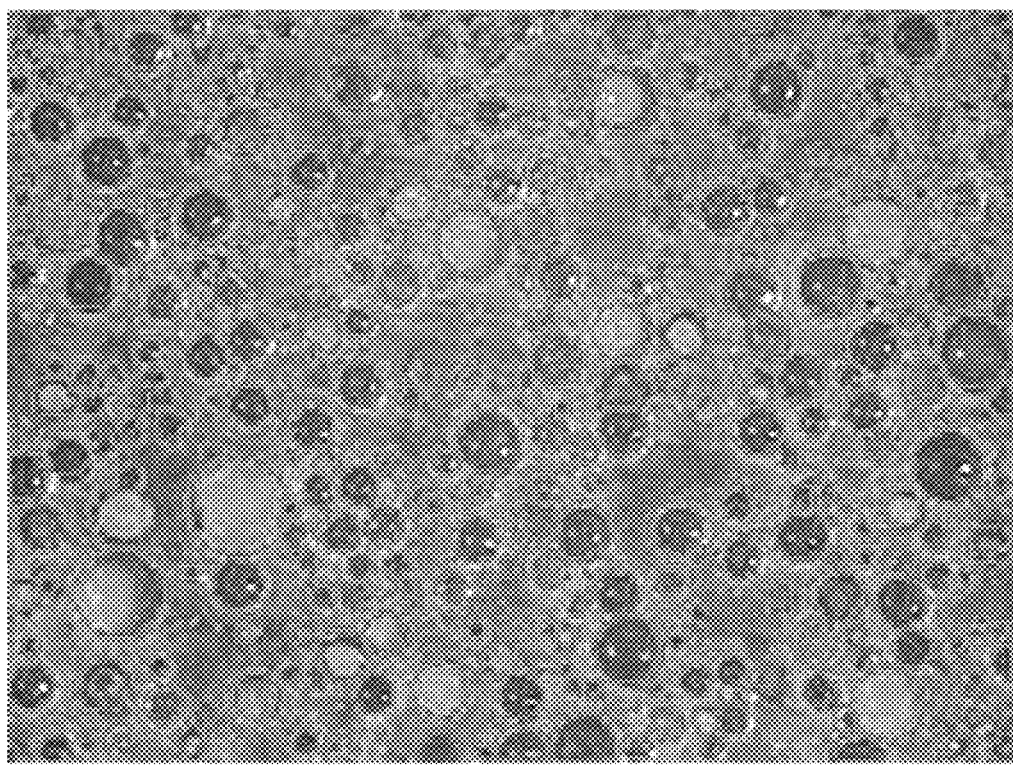
FIG. 2 is an SEM photograph of the porous polyurethane polishing pad produced in Example 1.

The polishing pad was cut into a square of 2 cm×2 cm (in a thickness of 2 mm) and observed with a scanning electron microscope (SEM) at a magnification of 100 times. An image was obtained using an image analysis software, and the sizes of the entire pores were measured from the image, from which the average pore size, the pore size distribution, and the ratio of pore area were calculated. The pore size distribution thus calculated is shown in FIG. 1, and the SEM photograph is shown in FIG. 2.

(4) Tensile Strength

The ultimate strength immediately before the fracture was measured while the polishing pad was tested at a rate of 50 mm/min using a universal testing machine (UTM).

(5) Elongation

The test was carried out in the same manner as the tensile strength measurement. The maximum deformation amount immediately before the fracture was measured, and the ratio of the maximum deformation amount to the initial length was expressed in a percentage (%).

(6) Modulus

The test was carried out in the same manner as the tensile strength measurement. The slope of the strain-stress curve in the initial elastic region was calculated.

(7) Surface Roughness (Ra)

The surface roughness of an area of 2.5 mm×1.9 mm of the polishing pad was measured using a 3D scope, and the surface roughness (Ra) was calculated according to the roughness standard of ISO 25178-2:2012.

(8) Polishing Rate of Tungsten and Silicon Oxide

A silicon wafer having a size of 300 mm with a tungsten layer formed by a CVD process was set in a CMP polishing machine. The silicon wafer was set on the polishing pad mounted on the platen, while the tungsten layer of the silicon wafer faced downward. Thereafter, the tungsten layer was polished under a polishing load of 2.8 psi while the platen was rotated at a speed of 115 rpm for 30 seconds, and a tungsten slurry was supplied onto the polishing pad at a rate of 190 ml/min. Upon completion of the polishing, the silicon wafer was detached from the carrier, mounted in a spin dryer, washed with purified water (DIW), and then dried with air for 15 seconds. The layer thickness of the dried silicon wafer was measured before and after the polishing using a contact type sheet resistance measuring instrument (with a 4-point probe). Then, the polishing rate was calculated with the following Equation 1.

Polishing rate=polished thickness of silicon wafer (Å)/polishing time (minute) [Equation 1]

In addition, the same procedures as the above were carried out in the same device, except that a silicon wafer having a size of 300 mm with a silicon oxide layer formed by a TEOS-plasma CVD process was used instead of the silicon wafer with a tungsten layer. The silicon wafer was set on the polishing pad mounted on the platen, while the silicon oxide layer of the silicon wafer faced downward. Thereafter, the silicon oxide layer was polished under a polishing load of 1.4 psi while the platen was rotated at a speed of 115 rpm for 60 seconds, and a calcined silica slurry was supplied onto the polishing pad at a rate of 190 ml/min. Upon completion of the polishing, the silicon wafer was detached from the carrier, mounted in a spin dryer, washed with purified water (DIW), and then dried with air for 15 seconds. The layer thickness of the dried silicon wafer was measured before and after the polishing using a spectral reflectometer type thickness measuring instrument (supplied by Kyence under the model name of SI-F80R). Then, the polishing rate was calculated with the above Equation 1.

TABLE 1

| | Ex. 1 |
|---|---|
| Specific gravity (g/cm$^3$) | 0.801 |
| Hardness at 23° C. (Shore D) | 60 |
| Hardness at 30° C./50° C./70° C. (Shore D) | 58/54/49 |
| Modulus (kgf/cm$^2$) | 70.8 |
| Tensile strength (N/mm$^2$) | 20.0 |
| Elongation (%) | 155 |
| Ratio of pore area (%) | 45.6 |
| Average pore size (μm) | 30 |
| Surface roughness (μm) | 4.02 |
| Polishing rate of tungsten (Å/min) | 1064.5 |
| Polishing rate of silicon oxide (SiO$_x$) (Å/min) | 993.5 |
| Selectivity of polishing rate (SiO$_x$/W) | 0.93 |
| Sum of the cross-sectional areas of the pores having a pore size of 33 μm to less than 38 μm in the total area of the pores | 7.3% |

TABLE 1-continued

| | Ex. 1 |
|---|---|
| Sum of the cross-sectional areas of the pores having a pore size of greater than 38 μm in the total area of the pores | 14.8% |

As shown in FIG. 1 and Table 1, in the pore size distribution of the pores based on the area of the polishing pad of Example 1, the pore size at the maximum peak was 23 μm, and the pore size at the maximum peak was smaller than the average pore size. In addition, the sum of the cross-sectional areas of the pores having a pore size larger than the pore size at the maximum peak by 15 μm or more was 14.8%, and the sum of the cross-sectional areas of the pores having a pore size larger than the pore size at the maximum peak by 10 μm to less than 15 μm was 7.3%, based on 100% of the total areas of the pores.

In addition, as shown in Table 1, the polishing pad of Example 1 had a polishing rate of silicon oxide (SiO$_x$) of 0.93 when the polishing rate of tungsten was 1.

The invention claimed is:

1. A porous polyurethane polishing pad, which comprises a polyurethane resin and pores distributed in the polyurethane resin,
    wherein in the pore size distribution of the pores based on the cross-sectional area of the polishing pad, the pore size at the maximum peak is smaller than the average pore size,
    the pore size at the maximum peak is 18 to 28 μm,
    the average pore size is 24 to 36 μm, and
    the sum of the cross-sectional areas of the pores having a pore size larger than the pore size at the maximum peak by 15 μm or more is larger than the sum of the cross-sectional areas of the pores having a pore size larger than the pore size at the maximum peak by 10 μm to less than 15 μm,
    wherein the porous polyurethane polishing pad contains the pores in an amount of 30 to 70% by volume based on the total volume of the polishing pad, and
    wherein the porous polyurethane polishing pad has a tensile strength of 10 to 100 kgf/cm$^2$ and an elongation of 30% to 300%.

2. The porous polyurethane polishing pad of claim 1, wherein the difference between the sum of the cross-sectional areas of the pores having a pore size larger than the pore size at the maximum peak by 15 μm or more and the sum of the cross-sectional areas of the pores having a pore size larger than the pore size at the maximum peak by 10 μm to less than 15 μm, based on 100% of the sum of the cross-sectional areas of the pores, is 1 to 10%.

3. The porous polyurethane polishing pad of claim 1, wherein the difference between the sum of the cross-sectional areas of the pores having a pore size larger than the pore size at the maximum peak by 15 μm or more and the sum of the cross-sectional areas of the pores having a pore size larger than the pore size at the maximum peak by 10 μm to less than 15 μm, based on 100% of the sum of the cross-sectional areas of the pores, is 5 to 9%.

4. The porous polyurethane polishing pad of claim 1, wherein the pores comprise first pores formed by a solid phase foaming agent and second pores formed by a gas phase foaming agent.

5. The porous polyurethane polishing pad of claim 4, wherein the second pores comprise pores having a pore size larger than the pore size at the maximum peak by 15 μm or more and pores having a pore size smaller than the pore size at the maximum peak.

6. The porous polyurethane polishing pad of claim 1, which further comprises a silicone-based surfactant; and at least one reaction rate controlling agent including at least one of a tertiary amine-based compound and an organometallic compound.

7. The porous polyurethane polishing pad of claim 1, further comprising a reaction rate controlling agent, and wherein the reaction rate controlling agent comprises at least one selected from the group consisting of triethylene diamine, dimethyl ethanol amine, tetramethyl butane diamine, 2-methyl-triethylene diamine, dimethyl cyclohexyl amine, triethyl amine, triisopropanol amine, 1,4-diazabicyclo(2,2,2)octane, bis(2-methylaminoethyl) ether, trimethylaminoethylethanol amine, N,N,N,N,N'''-pentamethyldiethylene triamine, dimethylaminoethyl amine, dimethylaminopropyl amine, benzyldimethyl amine, N-ethylmorpholine, N,N-dimethylaminoethylmorpholine, N,N-dimethylcyclohexyl amine, 2-methyl-2-azanorbornane, dibutyltin dilaurate, stannous octoate, dibutyltin diacetate, dioctyltin diacetate, dibutyltin maleate, dibutyltin di-2-ethylhexanoate, and dibutyltin dimercaptide.

8. The porous polyurethane polishing pad of claim 1, the pore size at the maximum peak is smaller than the average pore size by 1 to 10 μm.

9. The porous polyurethane polishing pad of claim 1, which has a polishing rate of silicon oxide ($SiO_x$) of 0.8 to 0.99 when the polishing rate of tungsten is 1.

\* \* \* \* \*